United States Patent [19]

Skutta

[11] Patent Number: 4,466,129
[45] Date of Patent: Aug. 14, 1984

[54] NOISE REDUCING CIRCUITRY FOR SINGLE SIDEBAND RECEIVERS

[75] Inventor: Frank R. Skutta, Palatine, Ill.

[73] Assignee: Motorola, Inc., Schaumburg, Ill.

[21] Appl. No.: 375,513

[22] Filed: May 6, 1982

[51] Int. Cl.$^3$ .............................................. H04B 1/10
[52] U.S. Cl. .................................. 455/219; 455/223; 455/311
[58] Field of Search .............. 455/212, 213, 218, 219, 455/222, 223, 224, 234, 303, 311

[56] References Cited

U.S. PATENT DOCUMENTS

| | | |
|---|---|---|
| 2,901,601 | 8/1959 | Richardson et al. . |
| 3,126,514 | 3/1964 | Germain et al. . |
| 3,191,123 | 6/1965 | Eness et al. . |
| 3,195,052 | 7/1965 | Cohn et al. . |
| 3,241,073 | 3/1966 | Hummel . |
| 3,284,714 | 11/1966 | Battin et al. . |
| 3,304,503 | 2/1967 | Walker, Jr. et al. . |
| 3,462,691 | 8/1969 | McDonald . |
| 3,534,268 | 10/1970 | Mazziota et al. ................... 455/218 |
| 3,544,904 | 12/1970 | Eness . |
| 3,588,705 | 6/1971 | Paine . |
| 3,623,144 | 11/1971 | Fischel et al. . |
| 3,725,674 | 4/1973 | Schaeffer et al. . |
| 3,868,577 | 2/1975 | Watt . |
| 3,876,943 | 4/1975 | Watt . |
| 4,189,679 | 2/1980 | Amazawa et al. . |
| 4,236,254 | 11/1980 | Augustin et al. ................... 455/223 |
| 4,266,296 | 5/1981 | Ishigaki ............................... 455/303 |
| 4,293,736 | 10/1981 | Ogita . |
| 4,334,317 | 6/1982 | Beesley ............................... 455/194 |

Primary Examiner—Marc E. Bookbinder
Attorney, Agent, or Firm—Rolland R. Hackbart; Ed Roney; James W. Gillman

[57] ABSTRACT

Improved noise reducing circuitry for high frequency signal sideband (SSB) receivers is described that substantially eliminates interference caused by impulse noise from a noise source 160. The SSB receiver includes first and second mixers 102 and 106 intercoupled by a crystal filter 104 having a passband that is approximately the same as the noise bandwidth of the antenna circuitry 100 when the SSB receiver is tuned to the lower frequency in its frequency band. A second intermediate frequency (IF) signal from second mixer 106 is coupled to an IF amplifier 122 and a noise amplifier 126. An envelope decector 128 is coupled to the output of noise amplifier 126 and provides an output signal having a magnitude proportional to the envelope of the noise amplifier output. Automatic gain control circuitry 132 is coupled to the output of the envelope detector for generating a gain control signal that reduces the gain of noise amplifier 126 as the magnitude of the envelope detector output increases. An impulse detector 130 is also coupled to the envelope detector output for detecting the presence of impulse noise and generating mute control signal pulses when impulse noise is detected. The mute control signal pulses are coupled to an attenuator 124 which attenuates the output of IF amplifier 122 so that the impulse noise does not create audible interference in the speaker 154 of the SSB receiver.

8 Claims, 2 Drawing Figures

NOISE REDUCING CIRCUITRY FOR SINGLE SIDEBAND RECEIVERS

BACKGROUND OF THE INVENTION

The present invention relates generally to noise reducing circuitry for radio frequency (RF) signal receivers, and more particularly to improved noise reducing circuitry that is particularly well adapted for use in single sideband (SSB) receivers.

High amplitude electrical impulse noise created by electrical machinery or lightning during electrical storms may be received by wideband antennas of RF signal receivers causing annoying interference. Although the impulse noise may be of relatively short duration, the internal circuitry of RF signal receivers can stretch impulses having a duration of tenths of microseconds to more than several milliseconds at the receiver's output. If such impulse noise is repetitive, such as, for example, spark ignition from vehicles and radiation from neon signs, the performance of an RF signal receiver can be degraded such that intelligible communications are impossible. Furthermore, the effects of such impulse noise are aggravated when the RF signal being received is relatively weak.

The problems caused by impulse noise have been alleviated somewhat in prior art receivers by using separate noise receiving circuitry tuned 2 to 3 mHz away from the operating frequency band of an RF signal receiver. Since impulse noise has a relatively wide bandwidth, noise is assumed to be present in the desired RF signal whenever detected by the separate noise receiving circuitry. Receivers including separate noise receiving circuitry are described in U.S. Pat. Nos. 3,623,144 and 3,725,674. However, such separate noise receiving circuitry is not only costly, but is also inadequate for wide band receivers since the characteristics of impulse noise may vary from one end of the band to the other.

SUMMARY OF THE INVENTION

Accordingly, it is an object of the present invention to provide improved noise reducing circuitry for use in RF signal receivers.

It is another object of the present invention to provide improved noise reducing circuitry for use in RF signal receivers that are operational at selected frequencies in a relatively wide frequency band, such as, for example, a frequency band extending from 2 mHz to 30 mHz.

It is yet another object of the present invention to provide improved noise reducing circuitry for use in RF signal receivers that is automatically disabled when the RF signal receiver is receiving a relatively strong desired RF signal.

Briefly described, the present invention encompasses improved noise reducing circuitry that is suitable for use in RF signal receivers that operate at selected signal frequencies in a relatively wide frequency band, such as, for example, a frequency band extending from 2 mHz to 30 mHz. The RF signal receiver may include antenna circuitry having a noise bandwidth that increases as the frequency of the RF signal increases, first and second signal sources for generating first and second injection signals, respectively, a first multiplier coupled to the antenna circuitry and the first signal source for multiplying the RF signals received by the antenna circuitry and the first injection signal to provide a first intermediate frequency (IF) signal, a filter coupled to the first multiplier for filtering the first IF signal, a second multiplier coupled to the filter and the second signal source for multiplying the filtered first IF signal and the second injection signal to provide a second IF signal, an amplifier coupled to the second multiplier for amplifying the second IF signal, and an attenuater coupled to the amplifier for reducing the amplitude of the amplified second IF signal in response to a mute control signal. The filter of the improved noise reducing circuitry may further be comprised of a crystal filter having a predetermined signal passband that is substantially identical to the noise bandwidth of the antenna circuitry when the RF signal receiver is tuned to receive the lowest frequency RF signal in its frequency band. The noise reducing circuitry also includes a second amplifier coupled to the second multiplier for amplifying the second IF signal, an envelope detector coupled to the second amplifier for providing an output signal having a magnitude proportional to the envelope of the amplified second IF signal therefrom, circuitry coupled to the envelope detector for detecting the presence of impulse noise from a noise source and generating the mute control signal when impulse noise has been detected, and circuitry coupled to the envelope detector for generating a gain control signal that is coupled to the second amplifier for varying its gain. The gain control signal reduces the gain of the second amplifier as the magnitude of the output of the envelope detector increases. As a result, the noise reducing circuitry will essentially be disabled when a relatively strong desired RF signal is being received.

DETAILED DESCRIPTION OF THE PREFERRED EMBODIMENT

Figure 1:
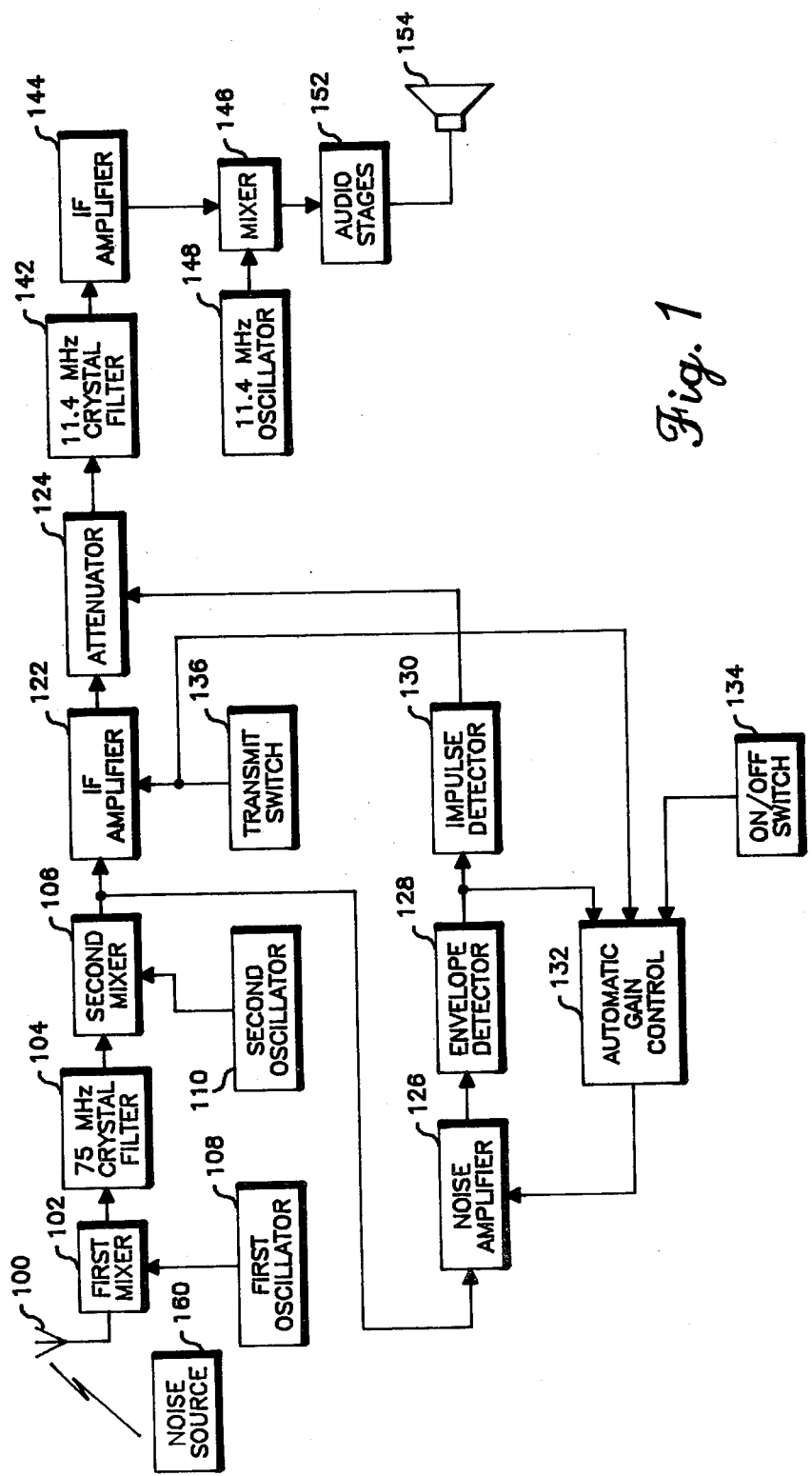
FIG. 1 is a block diagram of an RF signal receiver that may advantageously utilize the improved noise reducing circuitry of the present invention.

In FIG. 1, there is illustrated a block diagram of an RF signal receiver that may advantageously utilize the improved noise reducing circuitry of the present invention to reduce interference caused by noise source 160. In the preferred embodiment of the present invention, the RF signal receiver is a high frequency single sideband (SSB) receiver that is capable of receiving RF signals having frequencies at any possible multiple of 100 Hz between 2 mHz and 30 mHz. The noise bandwidth of antenna circuitry 100 of such an SSB receiver varies from approximately 20 kHz at an operating frequency of 2 mHz to over 1 mHz at an operating frequency of 30 mHz. By utilizing the improved noise reducing circuitry of the present invention, interference due to impulse noise from noise source 160 can be effectively eliminated at any selected operating frequency over the entire frequency band from 2 mHz to 30 mHz.

Referring to FIG. 1, RF signals are received by antenna circuitry 100 which may include a conventional antenna together with tuning circuitry (not shown). The antenna tuning circuitry may be used to match a particular antenna to the predetermined input impedance of an SSB reciever. The RF signals received by antenna circuitry 100 are coupled to first mixer 102. First mixer 102 multiplies the RF signals received by antenna 100 and a first injection signal provided by first oscillator 108 to provide a first IF signal having a frequency of 75 mHz in the preferred embodiment. The first IF signal from first mixer 102 is coupled to filter 104 which is preferrably a 75 mHz crystal filter. According to the present invention, the passband of crystal filter 104 is selected to approximate the noise bandwidth of antenna circuitry 100 when the SSB receiver is tuned to the lowest frequency in its frequency band. For example, the passband of crystal filter 104 may be 20 to 30 kHz in the preferred embodiment of the present invention for approximating the 20 kHz to 30 kHz noise bandwidth of antenna circuitry 100 at an operating frequency of 2 mHz. A commercially available crystal filter suitable for use in filter 104 is a type K100B crystal filter manufactured by Piezo Electronics, 100 Jones Road, Chicago, Ill.

The filtered first IF signal from crystal filter 104 in FIG. 1 is coupled to second mixer 106, which multiplies the filtered first IF signal and a second injection signal provided by second oscillator 110 to provide a second IF signal. The second IF signal provided by second mixer 106 has a frequency of 11.4 mHz in the preferred embodiment. The first and second injection signals provided by oscillators 108 and 110, respectively, may alternatively be provided by phase-locked loops, such as, for example, the phase-locked loops described and illustrated in copending patent application Ser. No. 350,966, entitled "Improved Method and Apparatus for Eliminating Interference Due to Spurious Signals Generated in Synthesized Receivers," invented by Frank R. Skutta and Thomas R. Klaus, filed Feb. 22, 1982 and assigned to the instant assignee.

The second IF signal from second mixer 106 in FIG. 1 is coupled to IF amplifier 122 and to noise amplifier 126. Noise amplifier 126 is a high gain amplifier which is used to amplify the impulse noise from noise source 160 that is received by antenna circuitry 100. The high energy impulse noise received by antenna circuitry 100 is attenuated and stretched in duration from less than a microsecond to tenths of a millisecond by crystal filter 104 and thereafter to several milliseconds by crystal filter 142. Because of the attenuation, the impulse noise must be amplified by noise amplifier 126 in order that it can be reliably detected. The output of noise amplifier 126 is coupled to envelope detector 128. Envelope detector 128 provides an output that has a magnitude proportional to the envelope of the amplified second IF signal from noise amplifier 126. The output of envelope detector 128 is coupled to impulse detector 130 and automatic gain control (AGC) circuitry 132. Impulse detector 130 generates a mute control signal whenever impulse noise is detected on the output of envelope detector 128. AGC circuitry 132 is preferably an average power detecting circuit that provides a gain control signal for varying the gain of noise amplifier 126. As the magnitude of the gain control signal increases, the gain of noise amplifier 126 is decreased. Thus, according to a feature of the present invention, as the strength of the received RF signal increases, the gain of noise amplifier 126 is decreased, such that impulse detector 130 is effectively disabled when a relatively strong desired RF signal is being received. Furthermore, if the impulse noise is at a relatively high rate, impulse detector 130 may likewise be disabled since the magnitude of the gain control signal increases as the rate of the impulse noise increases.

ON/OFF switch 134 is coupled AGC circuitry 132 for switching the +V supply voltage to the gain control signal for disabling the noise reducing circuitry when it is not needed. Since most SSB radios typically operate in a simplex mode, a transmit switch 136 is required to enable transmitting circuitry (not shown) when a radio user speaks. Transmit switch 136 is also connected to IF amplifier 122 and AGC circuitry 132 for disabling them when the SSB radio is in the transmit mode. As a result, speaker 154 is muted whenever the SSB radio is in the transmit mode.

Impulse detector 130 in FIG. 1 generates a mute control signal pulse of a predetermined time duration when impulse noise is present. The mute control signal pulses from impulse detector 130 cause attenuator 124 to reduce the amplitude of the amplified second IF signal from IF amplifier 122, preventing impulse noise from reaching crystal filter 142 where it would be stretched to several milliseconds and cause annoying interference. Attenuator 124 may be any suitable circuitry that attenuates or interrupts the amplified second IF signal in response to mute control signal pulses from impulse detector 130. In the preferred embodiment, attenuator 124 includes field effect transistor (FET) devices which electrically bypass the amplified second IF signal to signal ground in response to each mute control signal pulse from impulse detector 130.

The second IF signal from attenuator 124 in FIG. 1 is coupled to crystal filter 142 and thereafter to IF amplifier 144. The output of IF amplifier 144 is coupled to mixer 146, which multiplies the second IF signal with an 11.4 mHz injection signal from oscillator 148 for recovering audio signals modulated thereon. The recovered audio signals from mixer 146 are applied to audio stages 152 and thereafter to speaker 154. The audio demodulation circuitry 142, 144, 146, 148 and 152 may be any suitable conventional circuitry, such as that described in Motorola instruction manual numbers, 68P81025E95 and 68P81026E05, available from the Service Publications Department of Motorola, Inc., 1301 E. Algonquin Rd., Schaumburg, Ill.

Figure 2:
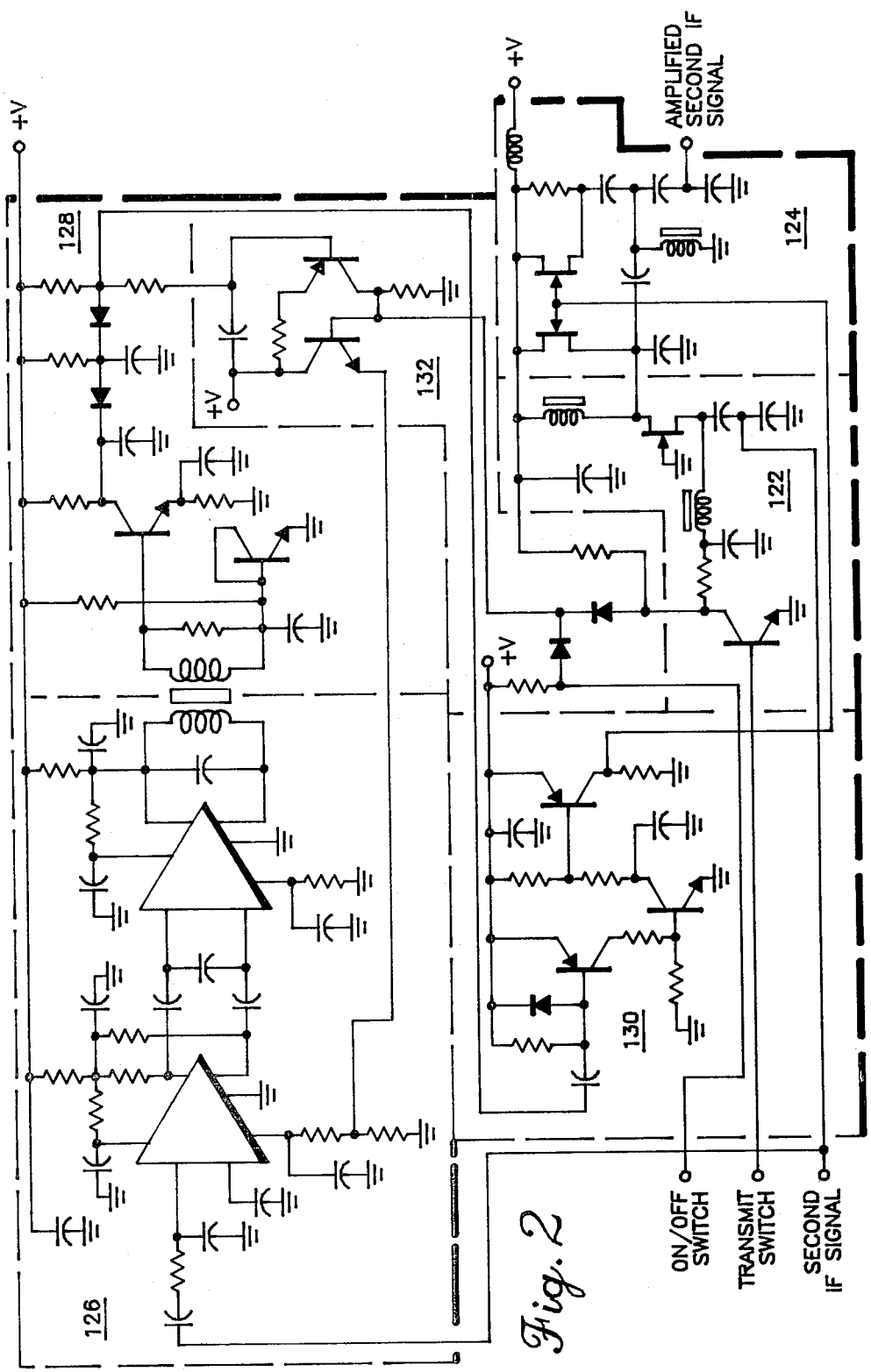
FIG. 2 is a detailed circuit diagram of a portion of the RF signal receiver in FIG. 1.

Referring to FIG. 2, there is illustrated a detailed circuit diagram for blocks 122, 124, 126, 128, 130 and 132 in FIG. 1. The detailed circuitry in FIG. 2 for corresponding blocks in FIG. 1 has been enclosed by dashed lines and labeled by the same reference numerals.

Noise amplifier 126 in FIG. 2 includes two Motorola type MC1350 amplifiers connected in cascade for providing as much as 80 db of gain. Envelope detector 128 is a conventional class B envelope detector that provides an output having an amplitude proportional to the envelope of the amplified second IF signal. Impulse detector 130 includes a capacitive differentiator for detecting negative going impulse noise transitions and a monostable triggered by the detected impulse noise for generating mute control signal pulses having a pulse duration of approximately 130 microseconds. Impulse detector 130 provides a positive going mute control signal pulse to attenuator 124 in response to each detected noise impulse. AGC circuitry 132 is a conventional average detecting circuit which averages the output of envelope detector 128 to provide the gain control signal to amplifier 126. Attenuator 124 includes a pair of shunt connected FET devices, which when enabled bypass the output of IF amplifier 122 to signal ground. IF amplifier 122 provides both gain and delay to the second IF signal. A certain amount of delay is necessary to provide sufficient time for both detecting the presence of impulse noise and enabling attenuator 124. During the delay provided by IF amplifier 122, impulse noise is detected by the circuitry in blocks 126, 128, 130 and 132 and attenuator 124 is enabled by the 130 microsecond mute control signal pulses so that the delayed impulse noise appearing at the output of IF amplifier 122 will not reach crystal filter 142 where it would have been stretched to several milliseconds in duration.

In summary, improved noise reducing circuitry for wide-band RF signal receivers has been described that effectively eliminates interference due to impulse noise over the entire frequency band of the receiver. Under strong signal conditions, the inventive noise reducing circuitry is automatically disabled. The improved noise reducing circuitry can be advantageously utilized in high frequency SSB receivers that receive RF signals having frequencies at any possible multiple of 100 Mz between 2 mHz and 30 mHz.

I claim:

1. Noise reducing circuitry for use in a radio frequency (RF) signal receiver receiving an RF signal having a frequency in a predetermined frequency band, said RF signal receiver including antenna means having a noise bandwidth that increases as the frequency of the RF signal increases, and cascaded first and second tunable circuits coupled to said antenna means providing first and second IF intermediate frequency signals, respectively, in response to tuning said receiver to a selected RF signal frequency in the predetermined frequency band, and said antenna means receiving noise signals from a noise signal source, said noise reducing circuitry further comprising:

filtering means for filtering the first IF signal and passing signals to the second tunable circuit in a passband that is substantially the same as the noise bandwidth of the antenna means when said receiver is tuned to the lowest RF signal frequency in the predetermined frequency band;

first amplifying means for amplifying the second IF signal, the gain of said first amplifying means being varied in response to a gain control signal;

envelope detecting means coupled to the first amplifying means for providing an output signal having a magnitude proportional to the envelope of the amplified second IF signal;

means coupled to the envelope detecting means for detecting the presence of noise signals and generating a mute control signal when noise signals are present;

means coupled to the envelope detecting means output signal for generating the gain control signal;

second amplifying means for amplifying the second IF signal; and attenuating means coupled to the second amplifying means for reducing the amplitude of the amplified second IF signal therefrom in response to the mute control signal.

2. The noise reducing circuitry according to claim 1, wherein the gain control signal generating means further includes means for disabling said noise reducing circuitry when the average of the output signal from the envelope detecting means exceeds a predetermined magnitude.

3. The noise reducing circuitry according to claim 1 or 2, wherein said filtering means comprises crystal filtering means.

4. The noise reducing circuitry according to claim 3, wherein said RF signal receiver is a single sideband receiving means for receiving and demodulating a modulated radio frequency signal, said receiving means including demodulating means coupled to the attenuating means for demodulating signals modulated on the amplified second IF signal therefrom.

5. Noise reducing circuitry for use in a radio frequency (RF) signal receiver receiving an RF signal having a frequency in a predetermined frequency band, said RF signal receiver including antenna means having a noise bandwidth that increases as the frequency of the RF signal increases, a first signal source for generating a first injection signal, a second signal source for generating a second injection signal, first multiplying means coupled to the antenna means and first signal source for multiplying the RF signals received by the antenna means and the first injection signal to provide a first intermediate frequency (IF) signal, means coupled to the first multiplying means for filtering the first IF signal, second multiplying means coupled to the filtering means and the second signal source for multiplying the filtered first IF signal and the second injection signal to provide a second IF signal, first means coupled to the second multiplying means for amplifying the second IF signal, and attenuating means coupled to the amplifying means for reducing the amplitude of the amplified second IF signal in response to a mute control signal, the first and second injection signals of said first and second signal sources, respectively, tuning said receiver to a selected RF signal frequency in the predetermined frequency band, and said antenna means receiving noise signals from a noise signal source, said noise reducing circuitry further comprising:

said filtering means comprising crystal filtering means having a predetermined signal passband that is substantially the same as the noise bandwidth of the antenna means when said receiver is tuned to the lowest RF signal frequency in the predetermined frequency band;

second amplifying means coupled to the second multiplying means for amplifying the second IF signal, the gain of said second amplifying means being varied in response to a gain control signal;

envelope detecting means coupled to the second amplifying means for providing an output signal having a magnitude proportional to the envelope of the amplified second IF signal;

means coupled to the envelope detecting means for detecting the presence of noise signals and generating the mute control signal when a noise signal is present; and means coupled to the envelope detecting means output signal for generating the gain control signal.

6. The noise reducing circuitry according to claim 5, wherein the gain control signal generating means further includes means for disabling said noise reducing circuitry when the average of the output signal from the envelope detecting means exceeds a predetermined magnitude.

7. The noise reducing circuitry according to claim 5 or 6, wherein said RF signal receiver is a single sideband receiving means for receiving and domodulating a modulated radio frequency signal, said receiving means including demodulating means coupled to the attenuating means for demodulating signals modulated on the amplified second IF signal therefrom.

8. A method for reducing noise in a radio frequency (RF) signal receiver receiving an RF signal having a frequency in a predetermined frequency band, said RF signal receiver including antenna means having a noise bandwidth that increases as the frequency of the RF signal increases, and cascaded first and second tunable circuits coupled to said antenna means providing first and second intermediate frequency signals, respectively, in response to tuning said receiver to a selected RF signal frequency in the predetermined frequency band, and said antenna means receiving noise signals from a noise signal source, said method comprising the steps of:

(a) filtering the first IF signal and passing to the second tunable circuit signals in a passband that is substantially the same as the noise bandwidth of the antenna means when said receiver is tuned to the lowest RF signal frequency in the predetermined frequency band;

(b) amplifying the second IF signal by a gain varied in response to a gain control signal;

(c) producing an output signal having a magnitude proportional to the envelope of the amplified second IF signal;

(d) generating the gain control signal from the output signal;

(e) detecting the presence of noise signals in the output signal;

(f) amplifying the second IF signal by a constant gain; and (g) reducing the constant gain amplitude of the amplified second IF signal when a noise signal is detected.

* * * * *

UNITED STATES PATENT AND TRADEMARK OFFICE
CERTIFICATE OF CORRECTION

PATENT NO. : 4,466,129
DATED : August 14, 1984
INVENTOR(S) : FRANK R. SKUTTA

It is certified that error appears in the above—identified patent and that said Letters Patent is hereby corrected as shown below:

Col. 8, line 14, delete "constant gain" and insert -- constant gain-- before "amplified".

Signed and Sealed this

Fifth Day of February 1985

[SEAL]

Attest:

DONALD J. QUIGG

Attesting Officer     Acting Commissioner of Patents and Trademarks